(12) United States Patent
Nguyen et al.

(10) Patent No.: US 7,629,804 B2
(45) Date of Patent: Dec. 8, 2009

(54) PROBE HEAD ASSEMBLY FOR USE IN TESTING MULTIPLE WAFER DIE

(75) Inventors: Vinh T. Nguyen, San Jose, CA (US); Claude A. S. Hamrick, Redwood Shores, CA (US)

(73) Assignee: Vertical Test Inc., San Jose, CA (US)

( * ) Notice: Subject to any disclaimer, the term of this patent is extended or adjusted under 35 U.S.C. 154(b) by 0 days.

(21) Appl. No.: 11/890,222

(22) Filed: Aug. 3, 2007

(65) Prior Publication Data

US 2008/0030214 A1 Feb. 7, 2008

Related U.S. Application Data

(60) Provisional application No. 60/835,784, filed on Aug. 4, 2006.

(51) Int. Cl.
*G01R 31/02* (2006.01)
(52) U.S. Cl. ...................................... 324/758; 324/754
(58) Field of Classification Search ......... 324/754–762, 324/158.1
See application file for complete search history.

(56) References Cited

U.S. PATENT DOCUMENTS

| | | | | |
|---|---|---|---|---|
| 5,642,054 A | * | 6/1997 | Pasiecznik, Jr. ............. | 324/754 |
| 6,218,910 B1 | * | 4/2001 | Miller ......................... | 333/33 |
| 6,686,754 B2 | * | 2/2004 | Miller ......................... | 324/754 |
| 6,838,893 B2 | * | 1/2005 | Khandros et al. ............ | 324/754 |
| 6,911,835 B2 | * | 6/2005 | Chraft et al. ................. | 324/754 |
| 2004/0051541 A1 | * | 3/2004 | Zhou et al. ................... | 324/754 |
| 2005/0035775 A1 | * | 2/2005 | Zhou et al. ................... | 324/754 |

* cited by examiner

*Primary Examiner*—Ha Tran T Nguyen
*Assistant Examiner*—Joshua Benitez
(74) *Attorney, Agent, or Firm*—IPxLAW Group LLP; Claude A. S. Hamrick

(57) ABSTRACT

A wafer probe head assembly for providing signal paths between an integrated circuit (IC) tester and input/output, power and ground pads on the surfaces of ICs formed on a wafer to be tested includes an adapter board and a probe card assembly including a space transformer and a contactor carrying substrate having a substantially planar bottom surface with printed or plated circuit traces formed thereon and a plurality of contactors plated to or photo-lithographically formed on the traces and arranged to simultaneously ohmically engage the contact pads of one or more ICs on a wafer under test. The contactors may include resilient supporting structures attached to or integrated with the signal carrying circuit traces. The probe card assembly may also include one or more substrate layers with the circuit traces and vias formed on and/or within the substrate layers to facilitate connection of the tester to the contactors.

19 Claims, 9 Drawing Sheets

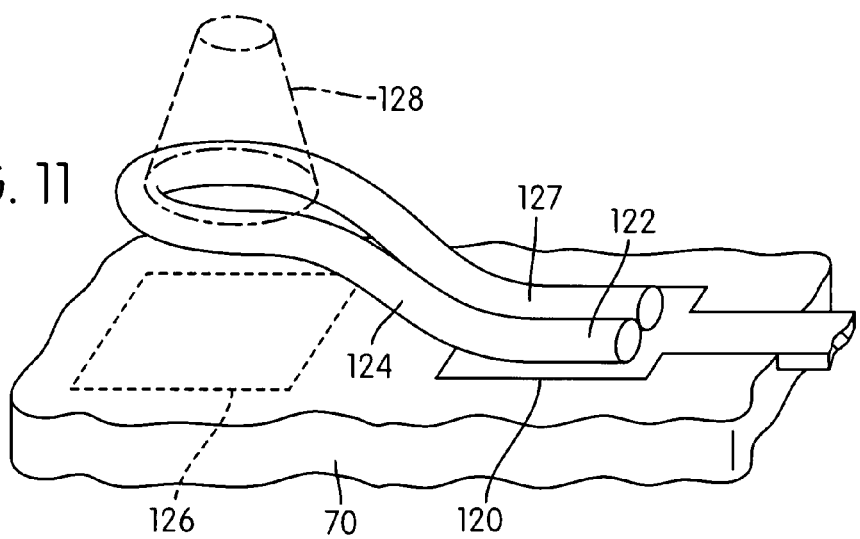
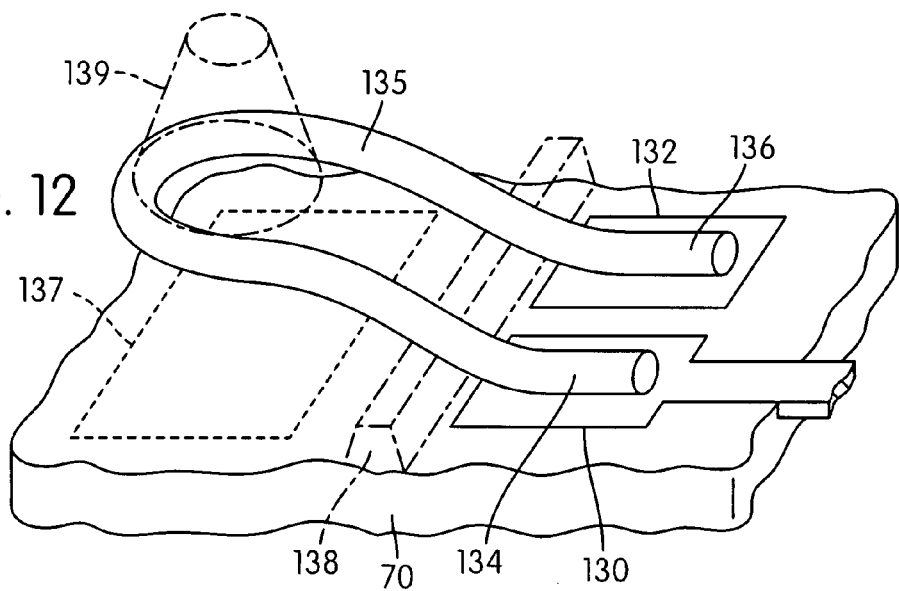
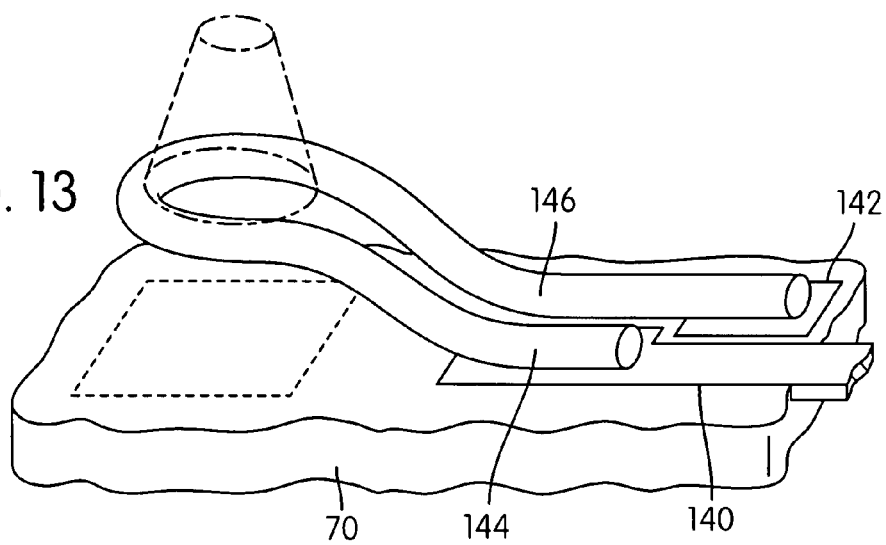

PROBE HEAD ASSEMBLY FOR USE IN TESTING MULTIPLE WAFER DIE

BACKGROUND OF THE INVENTION

1. Field of the Invention

The present invention relates generally to probe card apparatus for use in testing integrated circuit devices before they are separated from a silicon wafer upon which they are fabricated, and more specifically to a probe head assembly for providing conductive signal paths between an integrated circuit (IC) test equipment and probe tips provided on the bottom surface of a planar substrate and adapted to engage pads on the surface of ICs to be tested.

2. Description of Related Art

It is a common practice in the semiconductor industry to test integrated circuits (ICs) while they are still in the form of die on a semiconductor wafer. Such testing is accomplished through the use of probe card assemblies that connect test equipment to tiny probe pin structures that are caused to engage pads on the dies to be tested. Prior art probe card assemblies for providing signal paths between an integrated circuit tester and input/output (I/O) pads, power input pads and ground pads provided on the surface of ICs formed on a semiconductor wafer are disclosed in U.S. Pat. No. 5,974,662 issued Nov. 2, 1999 to Eldridge et al; U.S. Pat. No. 6,064,213 issued May 16, 2000 to Khandros, et al; U.S. Pat. No. 6,218, 910 issued Apr. 17, 2001 to Miller; and U.S. Pat. No. 6,965, 244 issued Nov. 15, 2005 to Miller.

As semiconductor devices get smaller and more compact, and the device densities increase, the number of contact pads not only increase in number but also decrease in size. The smaller size of the pads and the smaller pitch (center-to-center spacing between pads) make it more and more difficult to contact the pads to facilitate testing of the devices prior to packaging. Furthermore, as wafer size increases, the value (and cost) of testing the die chips prior to separation and packaging becomes greater. With each generation of device geometry change, it thus gets more difficult to use historical forms of mechanical devices and techniques to make physical contact with the multiplicity of die pads on a wafer. What is needed is a novel configuration, approach and mechanism for making test connections to the die pads prior to wafer disaggregation.

Accordingly it is a principal objective of the present invention to provide a novel wafer test probe apparatus having multiple die pad contactors arrayed in multiple groups with physical dimensions corresponding to the feature sizes of the devices being tested.

Another objective of the present invention is to provide an apparatus of the type described that can be made using the same or similar technology used to make the semiconductor device.

Still another objective of the present invention is to provide a wafer test probe head assembly having wafer pad contactors that do not necessarily depend on elongated flexible contact wires or rods to provide space transformation and the spring forces necessary to insure adequate contact-to-pad compliance.

A still further objective of the present invention is to provide a wafer test probe head assembly that is not pad size limited, tester I/O limited or wire bond limited.

Briefly, a presently preferred embodiment of the present invention is comprised of a wafer probe head assembly including an adapter board having a plurality of first electrical connection terminals distributed around its perimeter for connection to an integrated circuit (IC) tester, a probe card assembly including a space transformer and contactor carrying member formed of one or more layers of electrically non-conductive material and having a generally planar lower surface with an interior region circumscribed by a raised peripheral region, a plurality of wafer pad contactors formed on the planar lower surface within the interior region, a plurality of electrically conductive circuit traces formed on or above the planar lower surface and extending outwardly from ohmic engagement with the contactors to second electrical connection terminals formed on or above the peripheral region, suspension means for resiliently suspending the probe card assembly from the adapter board, and a plurality of conductors for electrically connecting the first terminals to the second terminals, such that when connected to a tester, and the probe head assembly is positioned above one or more wafer die to be tested, and when the contactors are aligned with and caused to engage the contact pads of the die, a test of one or more of the die on the wafer can be conducted.

A feature of the present invention includes a space transformer and contactor carrying assembly comprised of a space transforming layer having a first set of peripheral dimensions and affixed to and/or formed integral with a contactor carrying layer having a second set of dimensions less than the first set so as to provide a stepped perimeter around the contactor carrying layer. The stepped perimeter permits attachment of signal conductors to the circuit traces in a manner such that they do not interfere with the engagement between contactors and the die pads.

Another feature of the present invention includes contactors that are rigidly attached to the conductive traces and have pad engaging tips that lie with a common plane to engage the wafer pads as a wafer under test is raised into engagement with the probe head assembly.

An alternative embodiment of the present invention includes contactors that are attached to the conductive traces by resilient structures that enable a small degree of additional closing motion between the contactor carrying layer and the wafer to insure engagement between the contactors and non-planar wafer pads as a wafer under test is raised into engagement with the probe head assembly.

An important advantage of the present invention is that it permits substantially exact spatial correspondence between an extremely large number of contactors and die pads.

Another advantage of the present invention is that it allows the use of several board layers to array circuit traces extending from interiorly mounted wafer pad contactors to outboard connection terminals.

Still another advantage of the present invention is that it can be fabricated using existing photo-lithographic equipment, existing Computed Numerical Control (CNC) equipment, and existing wire bonding equipment.

These and other objects and advantages of the present invention will no doubt become apparent to those skilled in the art after a review of the following detailed description of the preferred embodiments illustrated in the several figures of the drawing.

BRIEF DESCRIPTION OF THE DRAWINGS

FIGS. 6-13 illustrate various contactor and associated contactor support structures made in accordance with the present invention;

DETAILED DESCRIPTION

Figure 1:
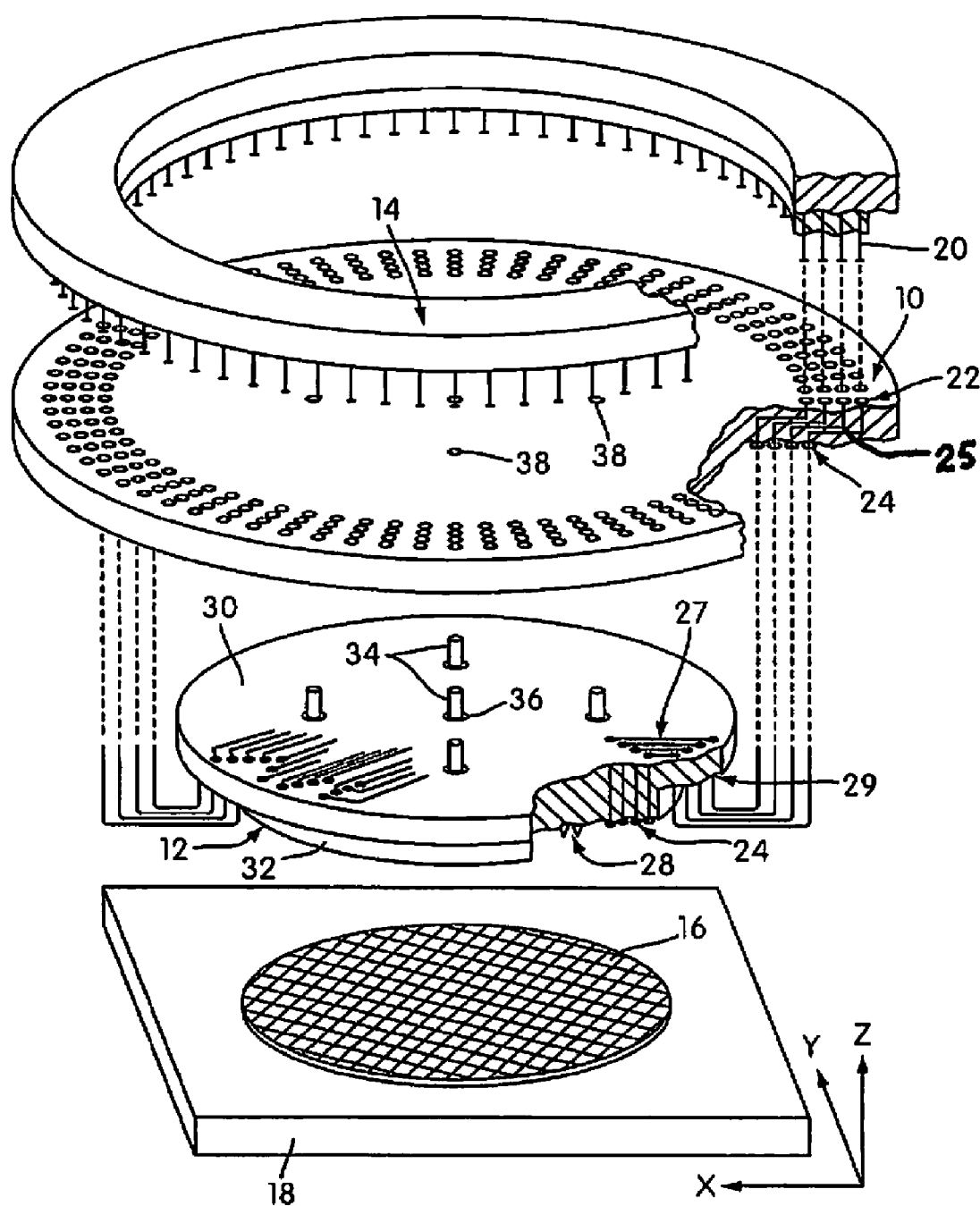
FIG. 1 is a partially broken and exploded perspective view illustrating the principal components of a probe head assembly in accordance with the present invention.

Turning now to FIG. 1 of the drawing, an embodiment of a wafer probe head assembly in accordance with the present invention is shown in exploded perspective and includes a spacer or adapter board 10, and a probe card assembly 12 positioned between a test equipment interfacing ring 14 and a semiconductor wafer 16 mounted on a wafer carrying chuck including an XYZ stage adapted to position the wafer 16 beneath and in operative alignment with the probe card assembly 12.

The ring 14 is part of an IC (integrated circuit) tester (not shown), and in the illustrated embodiment is in the form of an annular ring. It is to be understood however, that the ring 14 can be of any suitable shape and in many cases is square, rectangular or of other shapes intended to serve its intended purpose of providing an interface to a tester and a base to which a probe head assembly can be mounted. Arrayed around the bottom surface of ring 14 are a plurality of "pogo pins" 20; spring loaded contact pins that are adapted to conductively engage contact terminals of a probe head assembly.

As will be further described below, a probe head assembly in accordance with the present invention may be affixed to and suspended from ring 14 by a plurality of hangers, brackets or other means (not shown).

A probe head assembly in accordance with the present invention is preferably comprised of two principal components; an adapter board 10 and a probe card assembly 12. Board 10 in the illustrated embodiment is in the form of a disk 10 that may be formed of one or more layers of printed circuit board, or the like, having electrical conductors in the form of conductive circuit traces 25 plated or photo-lithographically developed thereon to electrically interconnect pogo pin landing pads, or terminals, 22 and wire connection terminals 24. The pads 22 are normally disposed in a standardized array around the upper surface of the periphery of the board so as to respectively be engaged by the pogo pins 20 of a tester of which ring 14 may be a part. As will be further described below, the terminals 24 are positioned in the periphery of board 10, inboard of the terminals 22.

The probe card assembly 12 of this embodiment is comprised of three basic components; a plurality of wafer pad engaging contactors 28, a space transformer disk 30, and a contactor carrying disk 32. The disks 30 and 32 have circuit traces 27 providing electrical signal paths leading from external terminals 29 to the contactors 28. As will be further explained below, the contactors 28 may be of various configurations, either rigidly or resiliently mounted to disk 32, and are disposed in one or more die pad engaging arrays on the bottom surface of disk 32. The positions of the contactors of each such array are arranged to correspond to and ultimately be in alignment with the contact pads of wafer dice forming particular types of integrated circuit devices to be tested in situ before they are separated from the wafer on which they are fabricated and subsequently packaged.

As illustrated in the drawing, the transformer disk 30 is of a particular configuration (circular in the embodiment depicted although it can have many other geometrical configurations) and is made of one or more layers of electrically non-conductive board having a first diameter (or other outer dimensions).

The contactor carrying disk 32 is likewise made of one or more layers of a suitable non-conductive material. In this embodiment, the disk 32 is circular and has an outer diameter substantially less than the above mentioned outer dimension (s) of the transformer 30. The lower surface is generally planer to correspond to the surface of a wafer to be tested. However as will be described below, it may have grooves or recesses formed therein or ridges or rails formed thereon.

Alternatively, the probe card assembly components 30 and 32 could be made as an integral body, or as a plurality of layers laminated together to form a single unit. In either case, in the illustrated embodiment the assembly is mounted to and resiliently suspended from the adapter board 10 by a plurality if spring loaded slides or guide pin hangers 34, or the like, that extend into bores 36 in transformer 30 and correspondingly positioned bores 38 formed in board 10. The purpose and function of hangers 34 is to maintain alignment of the probe card assembly 12 yet allow the assembly to move a small distance up and down (in the Z direction) relative to the board 10 and to provide operative wafer engaging forces as will be further described below.

Figure 2:
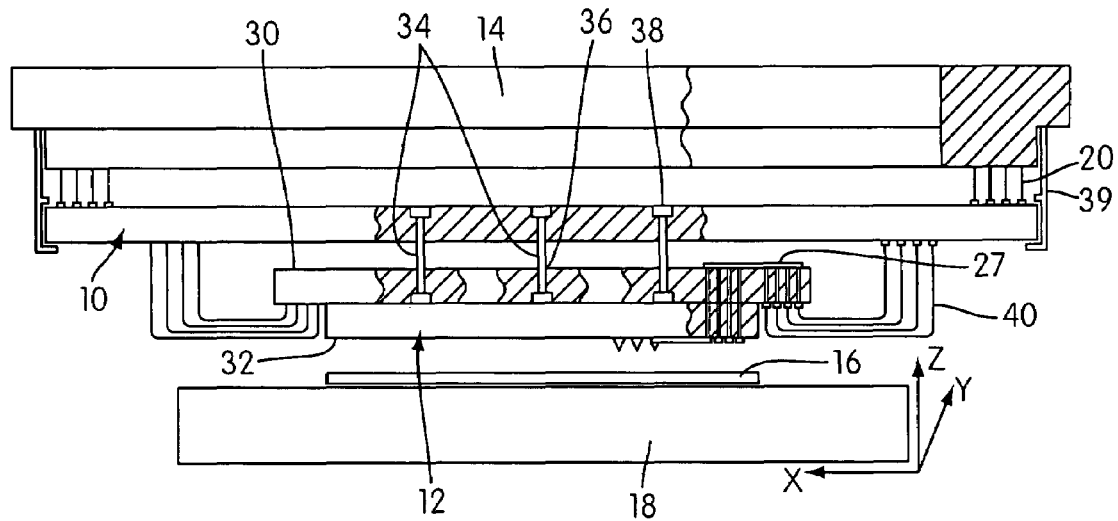
FIG. 2 is a partially broken elevational view of the probe head assembly of FIG. 1.
Figure 3:
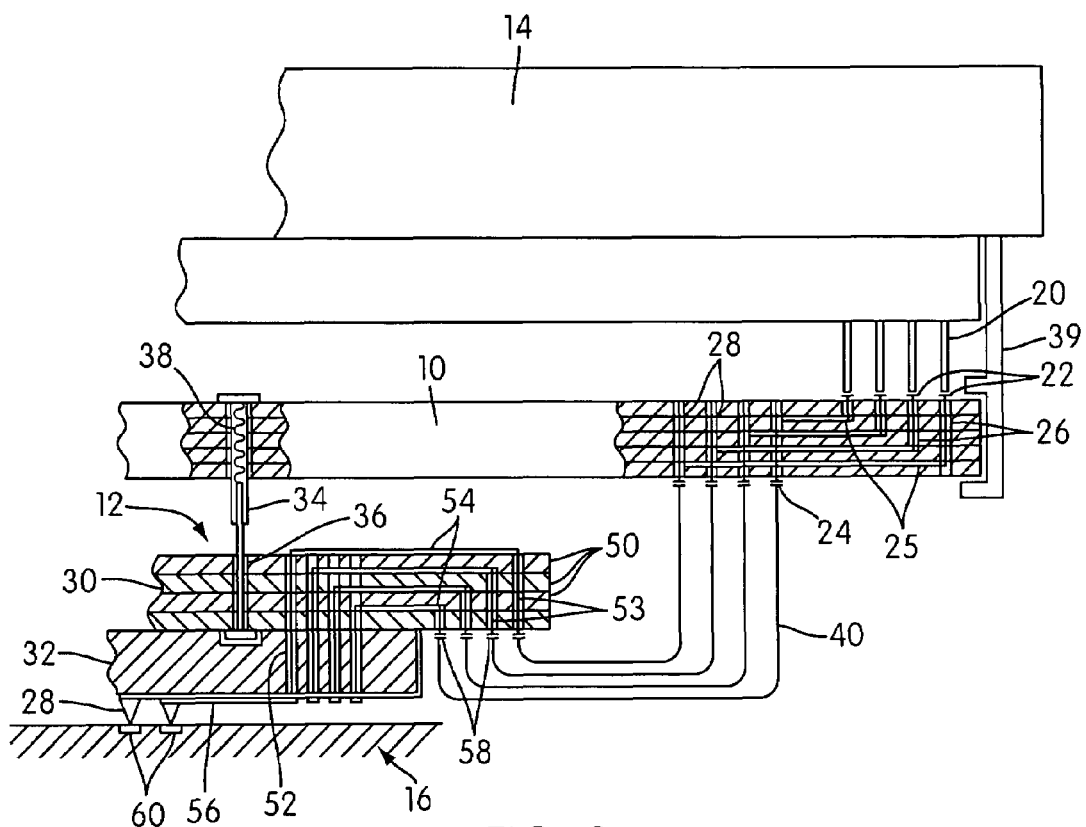
FIG. 3 is a an enlarged partial side view of the probe head assembly of FIG. 2, broken away as needed to reveal details of the embodiment.

Turning now to FIG. 2 which is a side elevational view of the components shown in FIG. 1 assembled but broken away in part to reveal detail, and to FIG. 3 which is an enlarged portion of that shown in FIG. 2, also broken to better reveal various details. As depicted, the probe head assembly is shown suspended from the tester ring 14 by brackets 39 that secure the board 10 in place so that the overall head assembly can not move or rotate relative to the tester. In such position the pogo pins 20 make good ohmic contact with the terminals 22 formed on the upper surface of the board. Note that as suggested in FIG. 3, the board 10 is formed of several layers of printed circuit board or the like so that circuit traces 25 can be conveniently arranged to connect, through vias 26 and 28, the terminals 22 and 24.

With respect to the details of probe card subassembly 12, it will be seen that the upper portion, transformer 30, is comprised of several layers 50 of non-conductive board, while the lower portion, or contactor carrier 32, is made of either multiple layers, or of a single layer, of non-conductive material. The materials used to make the transformer 30 need not be the same as that used to make the contactor carrying member 32. Both materials must be drillable to form vias 52 and 53, laminateable (if multiple layers are used), and surfaceable to accept printed or otherwise formed circuit traces 54 in the case of card 30, and 56 in the case of card 32.

Note that some of the traces 25 and 54 may be intended to carry signal and some may be intended to carry power or a reference (ground) potential. Furthermore, some of the traces may be grounded traces strategically positioned above, below and on both sides of signal traces to provide impedance control, and to prevent cross-talk between the signal handling conductors.

The electrically conductive traces 54 and 56 may be produced using photo-lithographic technology, ink jet printer technology, or any other suitable method capable of producing conductors of width, separation and conductivity appropriate to the application. As suggested in FIG. 3, circuit traces in the various layers, and the connection terminals 58 formed on the underside of the transformer portion extending beyond the perimeter of disk 32 are interconnected by conductively plating through the vertically extending vias 26 and 28 formed through the laminates as is well know in the art.

As mentioned above, the probe card assembly 12 is suspended from the adapter board 10 by the spring loaded hangers 34, or similar means, which enable the assembly to move vertically upward from its suspended position without rotation when its contactors 28 engage the contact pads 60 of a wafer 16 as the wafer is moved upwardly into test position as depicted in FIG. 3. The spring loaded hangers are calibrated for a particular assembly and contactor count to insure that a desired contact pressure is exerted by the contactors to provide good ohmic contact with the wafer pads. Other means of accomplishing this purpose will be discussed below.

Note that the terminals 58 of the assembly 12 are connected by a large number of wires 40 (typically in the thousands, but for simplicity only a few are shown) to the terminals 24 of board 10. The wires 40 are flexible and distributed substantially radially outwardly and around the outer perimeter of the transformer 30 so that the assembly 12 is free to move a small distance vertically relative to board 10. Some of the wires 40 may be signal wires and power wires, and some of the wires 40 may be ground wires strategically positioned above, below and on both sides of the signal wires to provide impedance control, and to prevent cross-talk between the signal handling conductors. Alternatively, coaxial conductors may be used having their outer conductors grounded. By extending the wires in the manner illustrated, any spring force contributed thereby to the assembly 12, as the wires are slightly deformed during vertical movement of the assembly, is minimized.

As is further shown in FIG. 3, and in alternative detail below, the contactors 28 may also be photo-lithographically developed, or otherwise formed (as disclosed below), at the distal ends of the conductive traces 56, or at the end of conductors extending through the vias. One example of how the contactors may be photo-lithographically formed is depicted in simplistic detail in the series of illustrations of FIGS. 4*a*-4*c*.

Figure 4A:
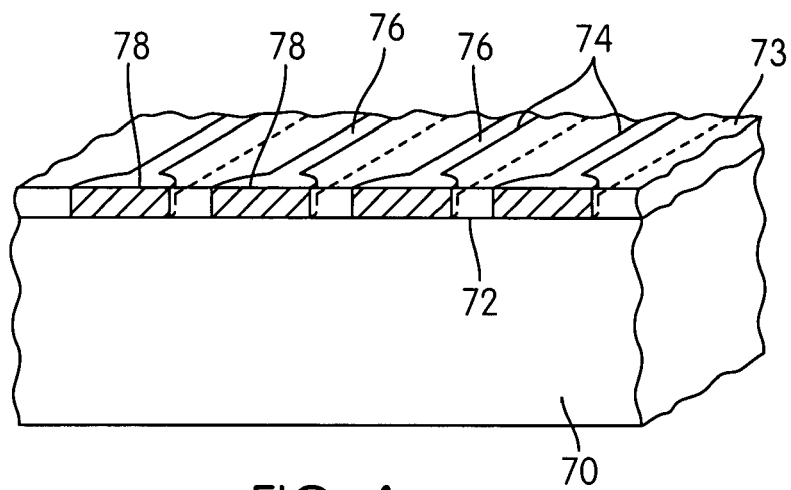
FIGS. 4a-4c are pictorial cross-sectional views diagrammatically illustrating contactor formation in accordance with one embodiment of the present invention.

As shown in FIG. 4*a*, the contactor carrying substrate 70 is shown inverted, and using well know photo-lithographic techniques, a layer of photo resist 73 is applied to the surface 72, patterned and then etched to open circuit trace paths 74 in the resist. The resulting surface is then plated with a suitable thickness of metal to fill the opened trace paths and the excess material is subsequently removed by etching or lapping until only the traces 76 and surrounding non-conductive layer 73 remains.

Figure 4B:
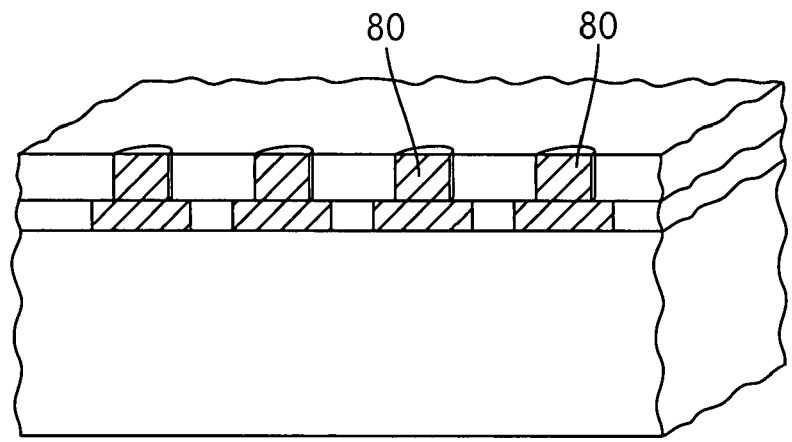

In order to build up metallic contactors at the distal, or terminal ends 78 of the traces 76, as suggested by FIG. 4*b*, the photo-lithographic process is repeated at the contactor sites one or more times until contactor studs 80 are developed. In transverse cross-section the contactor studs mat be rectangular, circular, elliptical, or of any other suitable configuration, and axially may be cylindrical, conical, cubicle or of any other suitable configuration.

It is preferable that the distal ends of the contactors be hard and as small in transverse section as appropriate to insure that they will penetrate any oxide or passivation material formed over the wafer pads to be engaged. The contactors may be made of a single material or a combination of materials, or layers of material, to achieve a desired hardness or rigidity. Moreover, as described below, the contactors may be formed on conductive pads or other lead end structures that may be rigid or resilient, and if resilient, have the characteristic that they allow little if any lateral contactor translation during wafer pad engagement.

Figure 4C:
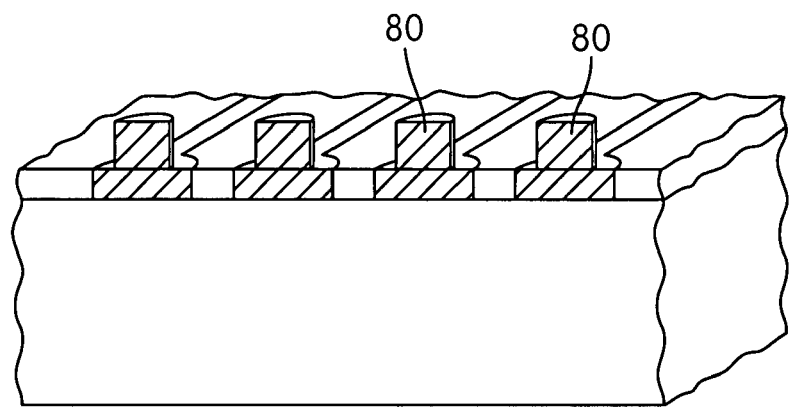
Figure 5:
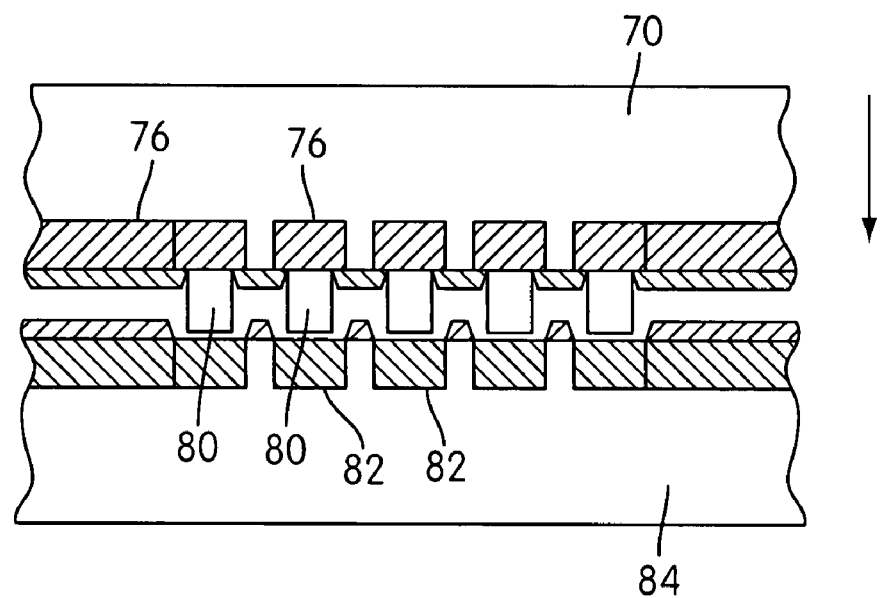
FIG. 5 is cross-sectional view illustrating contactor-to-wafer pad engagement in accordance with the present invention.

Removal of the final photo resist, as depicted in FIG. 4*c*, leaves a plurality of up-standing studs that, when the substrate is again inverted, form the contactors 80 for a probe card assembly that can be used to engage the wafer contact pads 82 of a die 84 as illustrated in FIG. 5, and thus permit testing of the on the wafer dice.

Figure 6:
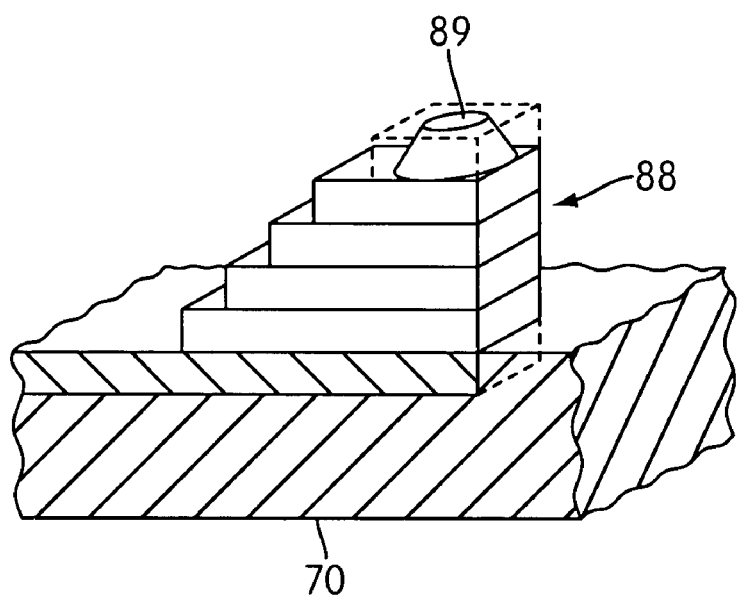
Figure 7:
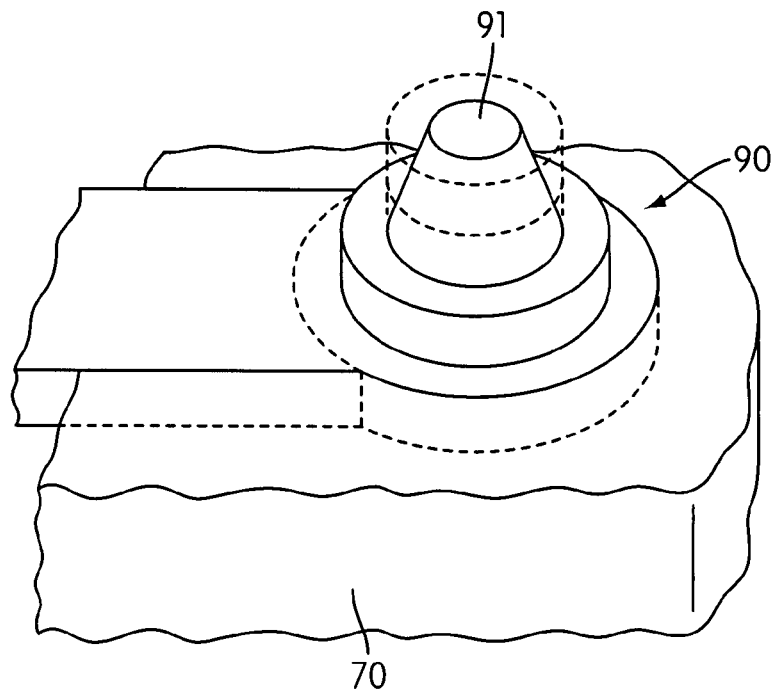

Turning now to FIGS. 6 and 7 examples are shown at 88 and 90 of alternative contactor constructions that can be developed in the manner described above. In these cases the size of the plated stud component formed at successive layer steps is reduced to form a tapered contactor. It will also be appreciated that the last layer of metal formed or otherwise deposited or attached, and intended to constitute the contact tip (89 or 91) of the contactor, may be of a different metal or other conductor type than the earlier layers. In addition, a different processing technique may be used to shape the pad engaging tip.

Figure 8:
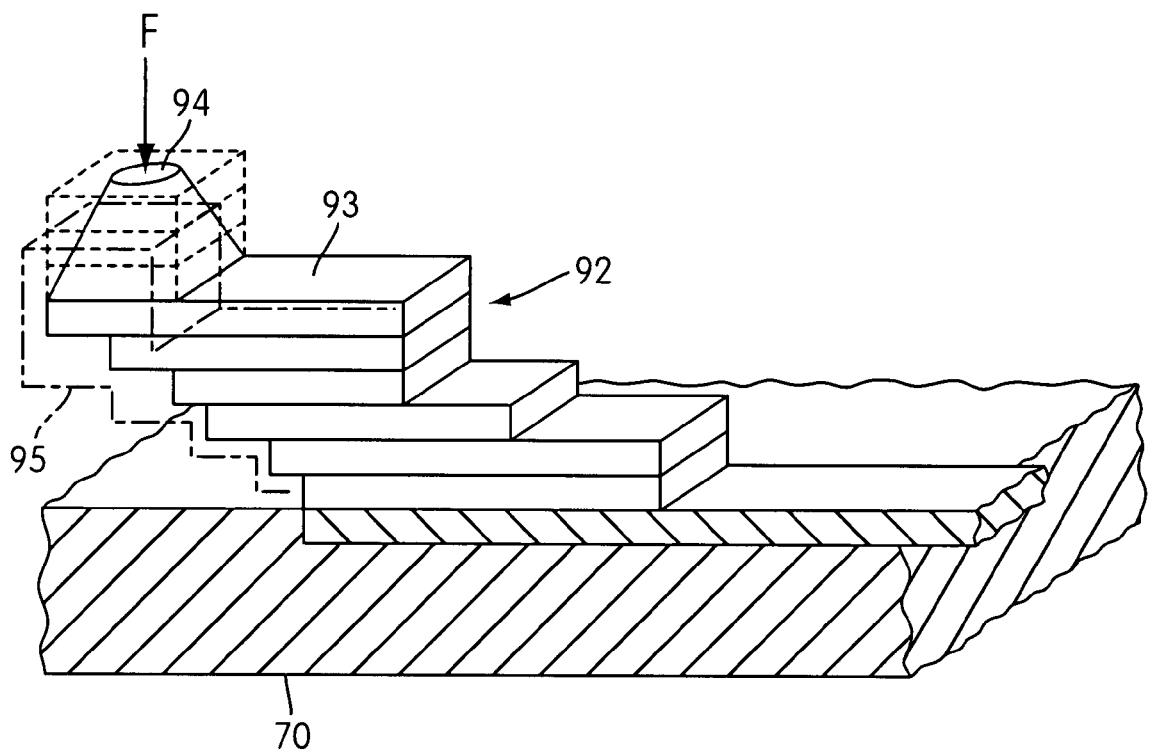

In FIG. 8 an alternative, vertically displaceable or resilient form of contactor is illustrated at 92 and formed by laterally offsetting successive contactor building layers to form a corbel-like structure 93 that upon application of a force F to its contacting tip 94 (during wafer pad engagement) causes a slight resilient deformation thereof as suggested by the dashed lines 94, such resilient deformation having the intended purpose of accommodating compliance with out-of-plane wafer pads.

Figure 9:
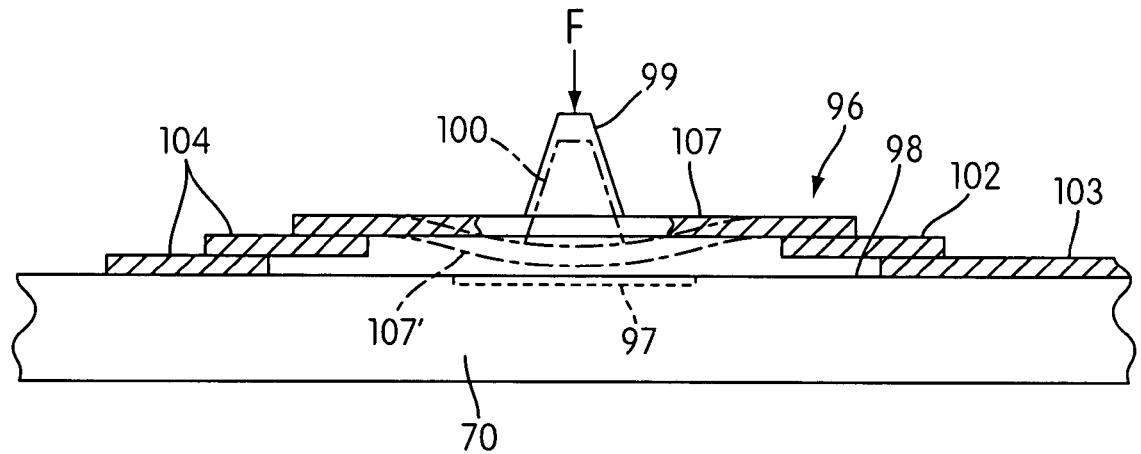

FIG. 9 illustrates another form of resiliently displaceable contactor configuration in which a bridge-like structure 96 is photo-lithographically formed by plating, depositing or otherwise forming "abutments" 102 (at the end of a signal trace 103) and 104, and then a bridging strip 107 spanning an area 97 of the probe card disk surface 98 intended to directly correspond to a particular wafer pad (not shown) location when the probe card assembly is in a test position. The photo resist is then preferably removed beneath the bridge in whole or in part by undercut etching or other techniques thereby providing clearance beneath the bridge to allow resilient deformation as suggested by the dashed lines 107'.

The bridging strip 107 may be of rectangular or other planform and is preferably made of a material having good resilient or elastic characteristics so that if deformed during wafer pad engagement, it will subsequently return to its original configuration upon disengagement.

After the bridge is formed, probe tip 99 can be formed using photo-lithographic steps as described above, or can be deposited using other attachment, plating or tip forming techniques.

Figure 10:
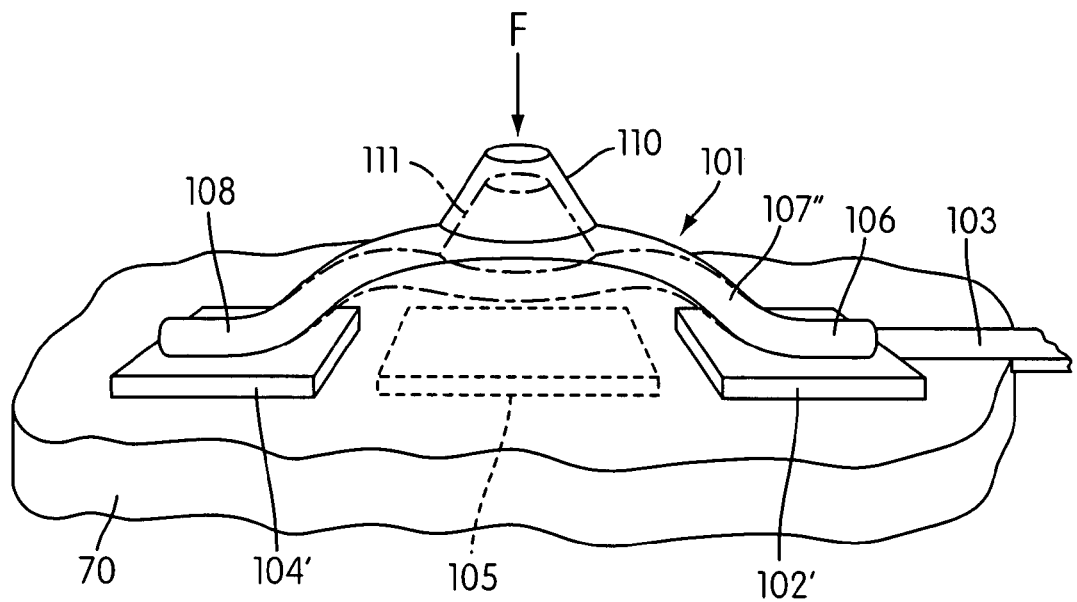

As shown in FIG. 10 a similar bridge-like contactor structure 101 can be formed in accordance with the present invention by lithographically or otherwise fabricating a metallic pad 102' (similar to the pad 102 of FIG. 9) at the end of a trace, and another pad 104' on the opposite side of a substrate space 105 intended to correspond to and overlie a wafer pad location when the probe card assembly is in a test position relative to a wafer die (not shown). However, in this alternative, the bridging structure is formed using a wire bonder to attach one end 106 of a length of resilient and conductive wire to the pad 102', to raise and stretch out the length of wire across the virtual pad location 105, and then to lower and attach the other end thereof to the pad 104' to form a bridge 107" similar to the bridge 107 of FIG. 9. With the bridging wire in place, a contactor tip 110 may be attached by spot plating, or by even using the wire bonder to attach a small loop or segment of wire thereto to form the tip 110. As in the cases of the other displaceable contactor embodiments described above, the application of a force F to the tip 110 will cause it to resiliently deform downwardly as indicated by the dashed lines 111.

It will be understood and appreciated that by use of any of these displaceable tip contactor structures, good contactor-to-pad compliance will be obtained without the necessity of relying entirely upon the probe card assembly suspension spring force to conform the contactor tips to pads that extend higher or lower than the pad design level or elevation. In essence, these displaceable contactor structures provide a vernier-like addition to the main loading force which tends to insure more uniform contactor-to-pad engagement.

Referring now to FIGS. 11, 12 and 13, alternative embodiments of resilient contactor structures are disclosed in which a wire bonder is used to fabricate the resilient components thereof. In FIG. 11 for example, a trace terminal pad 120 is formed on a probe card substrate 70, and a wire bonder (not shown) is used to attach a wire end 122 to the pad, to stretch out and raise a half length 124 of the wire across the surface location 126 on substrate 70 corresponding to a wafer pad to be engaged, to fold the wire and stretch a second half length of the wire back across the area 126, lower the end thereof and attach it to the pad 120. in this embodiment, the loop per se may be used as the contactor, or as in previous embodiments, a contactor tip 128 may be formed and attached to the loop as suggested by the dashed lines.

An alternative loop form is shown in FIG. 12 at 135 wherein the probe assembly pads 130 and 132 to which the loop ends 134 and 136 are attached are laterally separated. In some embodiments it may be desirable to construct a loop supporting rib 138 on the surface of substrate 70 during fabrication thereof as an aid to formation of the loop 135, or as a support for the base of the loop. Such a support may tend to enhance and perhaps preserve the resilient action of the loop over time or extended usage. Similarly, it may be deemed appropriate to provide grooves or recesses (not shown) in the substrate surface region 137 to accommodate flexing of the resilient contactor (139) carrying structure 135.

In FIG. 13 a third loop embodiment is depicted wherein laterally and longitudinally displaced, and electrically separated pads 140 and 142 are provided for attachment of the loop ends 144 and 146. This configuration of pads may enable a tighter pad pitch than the previously described configurations.

Figure 14:
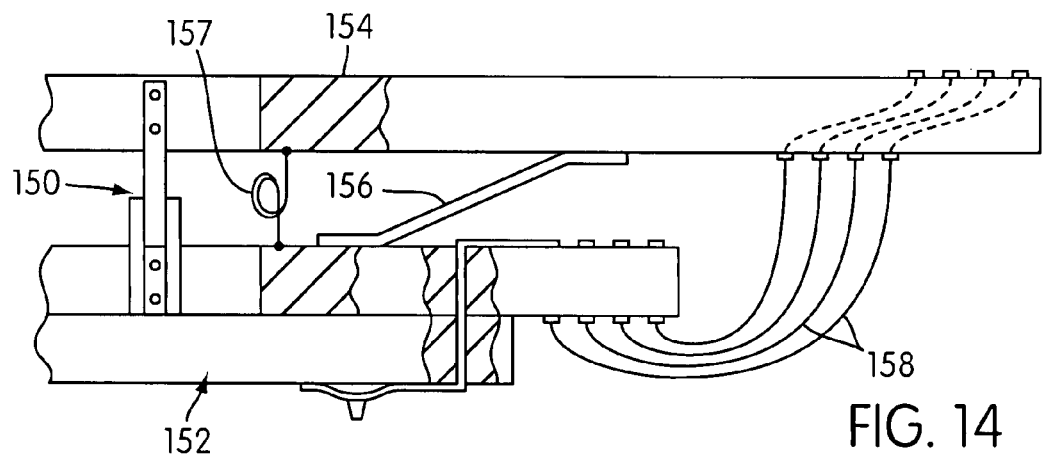
FIGS. 14, 14a and 15 are partially broken cross-sectional views illustrating suspension details in accordance with embodiments of the present invention.
Figure 14A:
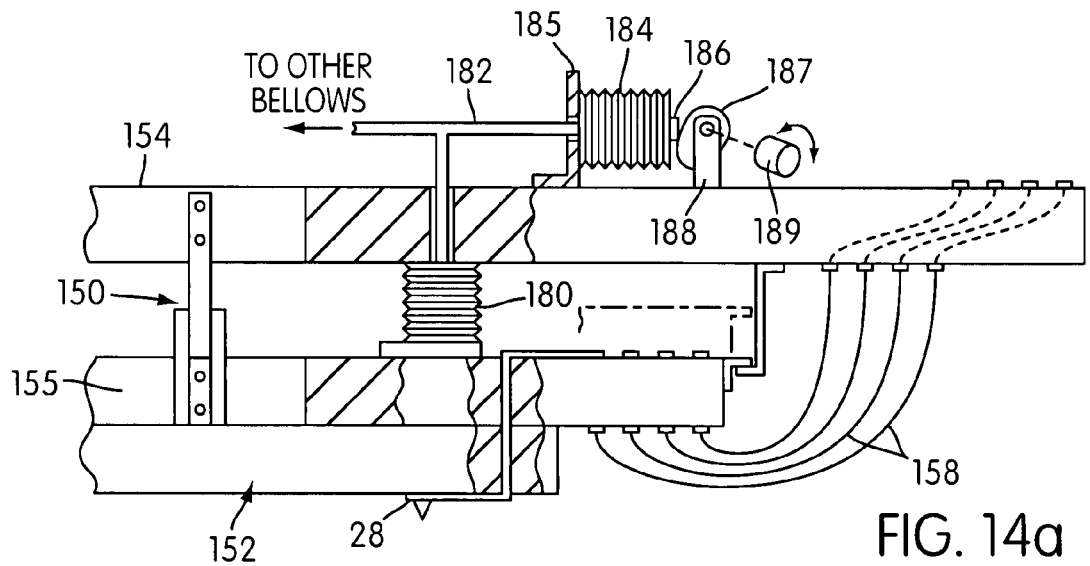
Figure 15:
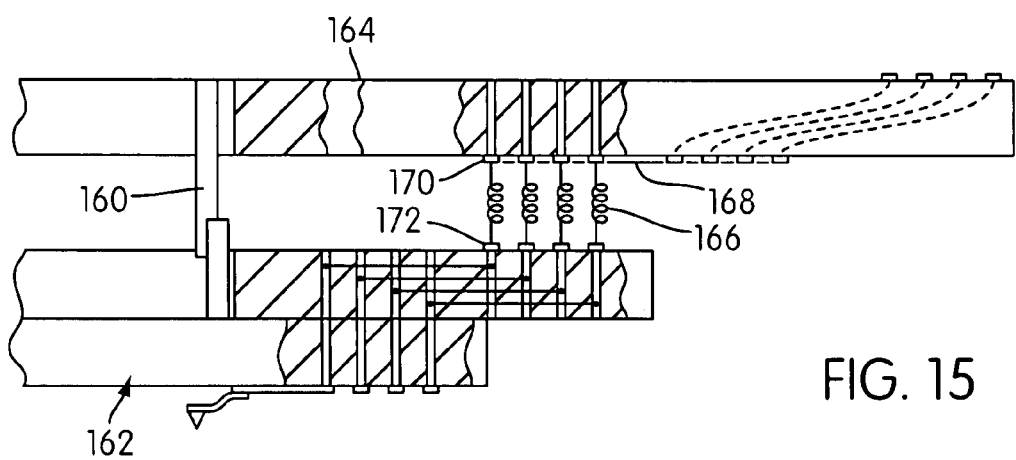

In FIGS. 14, 14a and 15, alternative forms of probe card assembly suspensions are illustrated. In FIG. 14 for example, a plurality of precision slider guides 50 are used to insure precise vertical control of motion of the probe card assembly 152 relative to the adapter board 154 (corresponding to element 10 in FIG. 1). In this embodiment a plurality of S-springs or Z-springs 156 disposed around the assembly are used to resiliently suspend the assembly relative to board 154.

An alternative form of suspension that allows spring biasing force selection is shown in FIG. 14a. In accordance with this embodiment, at least three bellows-like devices 180 are positioned around the probe card assembly 152 to resiliently suspend the assembly from the adapter board 154. The opposite ends of the several bellows-like devices 180 are secured to the facing surfaces of board 154 and transformer 155 by an epoxy or the like, or suitable mechanical fasteners, and are pneumatically coupled by suitable tubing 182 to another bellows-like device 184 that is mounted at one end to the adapter board 154 by a suitable mounting bracket 185 and is intended to serve as a pneumatic pressure selection means.

The pneumatic circuit including the several bellows devices 180, the bellows device 184 and the connecting, or manifolding, tubing 182 is filled with air or other suitable compressible gas and is pressurized to a level of pressurization determined by the range of spring force calculated for application to the probe card assembly. It will be appreciated that depending on the size of the assembly, the number of contactors included, the calculated contactor engagement force, and other factors, the number of and positioning of the several bellow devices 180 may range from one (if other spring devices are also included to balance the force to be applied across the assembly) to many. However, it is anticipated that at least three such devices will be utilized.

The other end of device 184 is provided with a cam follower 186 that engages a cam 187 rotatably mounted to board 154 by a bracket 188. The cam 187 is selectively rotatable by a suitable dial or other means 189. As will be understood by those skilled in the art, rotation of cam 187 will cause expansion or contraction of the volume of bellows device 184 thereby changing the pressurization and thus the resiliency of, and spring force attributable to, the several bellows devices 180. Adjustment of the pressurization may be made manually during set-up or dynamically under automatic control during operation (by means not shown) to account for test environment temperature, measured overall contactor pressure, etc. This embodiment thus allows heretofore unavailable selective adjustment of the spring force applied by the contactors 28 to a wafer under test.

The alternative embodiment illustrated in FIG. 15 likewise uses precision sliders 160 to insure precise vertical control of motion of the probe card assembly 162 relative to the adapter board 164, as in FIGS. 14 and 14a, but instead of, or in addition to, the S-springs or pneumatic springs, this embodiment uses coil springs 166 to resiliently suspend the assembly relative to board 164. In this embodiment the coil springs 166 also serve as signal connecting conductors used in place of the wires 158 of FIG. 14. Note that to accommodate the use of the springs 166, circuit traces 168 and contact pads 170 and 172 are provided to which the springs 166 are attached.

Figure 16:
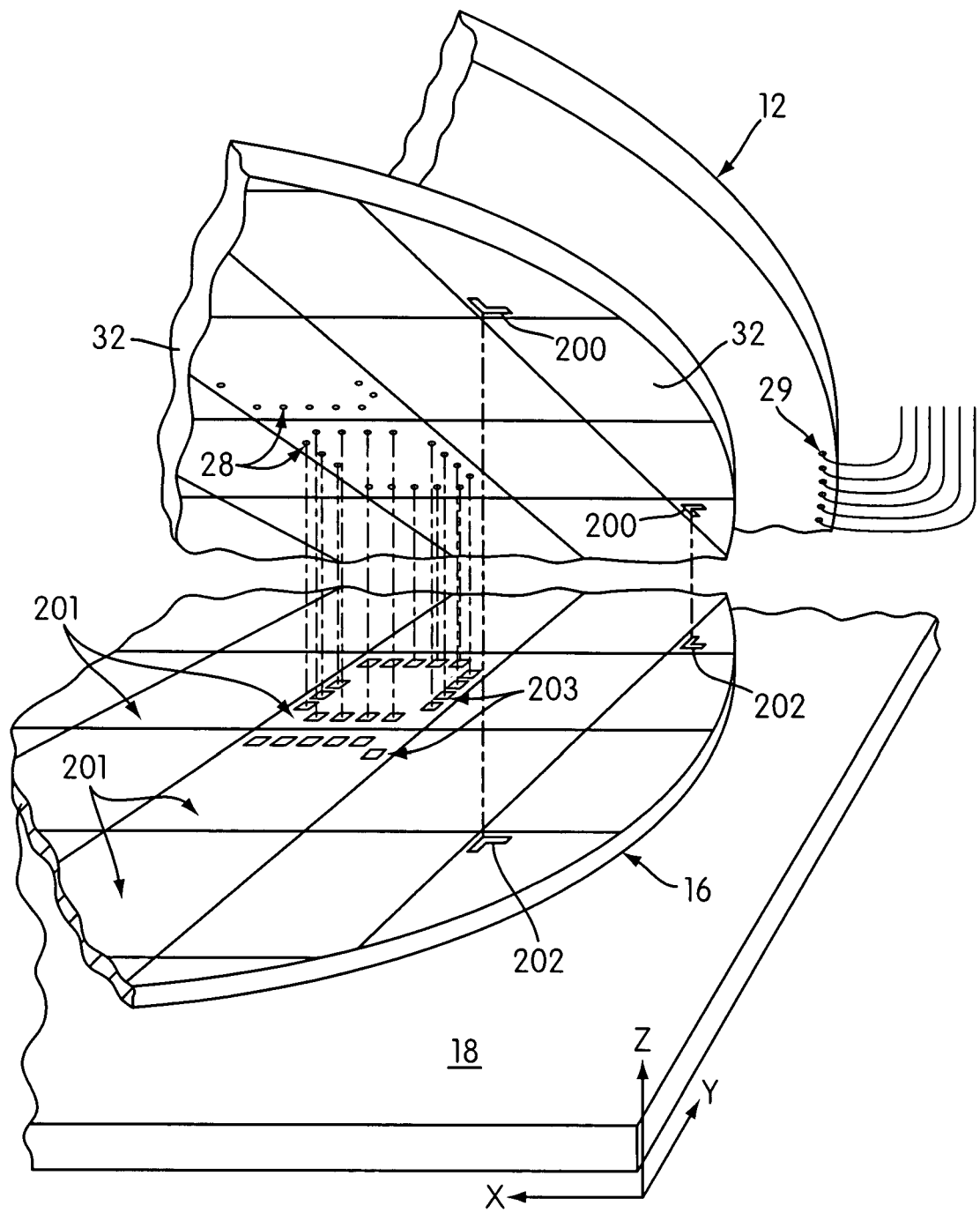
FIG. 16 is a broken perspective view schematically illustrating operation of an embodiment of the present invention.

In FIG. 16 a pictorial view is presented, illustrating in stylized form, operation of the present invention. In this depiction a probe card assembly 12 is schematically shown suspended above a wafer 16 that is being raised into test position by a chuck 18. In this embodiment the assembly 12 includes multiple sets of contactors 28 arrayed to simultaneously engage the contact pads 203 of multiple dice 201 fabricated on a wafer 16. As the chuck is raised, alignment of the wafer 16 relative to the assembly 12 is accomplished in a well understood manner using fiducials 200 and 202 provided on the surfaces of substrate 32 and the wafer surface respectively. It will be appreciated that once the contactors engage the contact pads, test signals can be applied to the dies through the probe head assembly.

Although the present invention has been particularly shown and described above with reference to specific embodiments, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A wafer probe head assembly, comprising:
an adapter board having a plurality of first electrical conductors distributed around its periphery and having first terminals respectively formed on one end of each of said first conductors and located proximate said periphery for connection to an integrated circuit (IC) tester, and second terminals respectively formed on an opposite end of said first conductors and located inboard of said first terminals;
a probe card assembly including
a contactor carrying member formed of one or more layers of electrically non-conductive material and having a planar lower surface with an interior region circumscribed by a peripheral region;

electrically conductive circuit traces formed on or above said planar lower surface and extending outwardly from distal extremities thereof located in said interior region and on said lower surface, to third terminals located in said peripheral region; and a plurality of contactors formed in one or more arrays on said planar lower surface within said interior region and in ohmic association with said distal extremities;

resilient suspension means for moveably suspending said probe card assembly from said adapter board in precision vertical alignment; and a plurality of electrical signal conductors electrically connecting said third terminals to said second terminals, whereby when said probe head assembly is positioned above a wafer to be tested and said contactors are aligned with and caused to engage the contact pads of the wafer, said probe card assembly is caused to move upwardly relative to said adapter board and against the resilient force of said suspension means, and a test of one or more ICs formed on said wafer can be conducted by said integrated circuit (IC) tester.

2. A wafer probe head assembly as recited in claim 1 wherein circuit traces and/or said contactors are at least in part photo-lithographically formed on said distal extremities.

3. A wafer probe head assembly as recited in claim 1 wherein said contactor carrying member includes a space transformer layer having a first set of peripheral dimensions, and a wafer facing layer having a second set of dimensions less than said first set so that said contactor carrying member has a stepped perimeter defining said peripheral region.

4. A wafer probe head assembly as recited in claim 3 wherein said third terminals are formed on a wafer facing surface of said stepped perimeter.

5. A wafer probe head assembly as recited in claim 1 wherein said contactors include a wafer pad engaging probe tip carried by a resilient structure formed in ohmic engagement with one of said distal extremities.

6. A wafer probe head assembly as recited in claim 5 wherein said resilient structure includes a plurality of metallic layers photo-lithographically formed over one of said distal extremities.

7. A wafer probe head assembly as recited in claim 6 wherein said plurality of metallic layers are stacked in corbel-fashion to form a cantilevered structure with a probe tip formed at the distal end thereof.

8. A wafer probe head assembly as recited in claim 6 wherein at least one of said metallic layers forms a bridge over an area of said planer lower surface intended to overlie a wafer pad to be contacted.

9. A wafer probe head assembly as recited in claim 8 wherein a probe tip is formed on a mid span portion of said bridge.

10. A wafer probe head assembly as recited in claim 5 wherein said resilient structure includes a length of wire at least one end of which is bonded to one of said distal extremities.

11. A wafer probe head assembly as recited in claim 10 wherein said resilient structure includes a length of wire at least one end of which is bonded to said one distal extremity.

12. A wafer probe head assembly as recited in claim 11 wherein said length of wire is folded and the opposite end thereof is bonded to said planer lower surface such that the folded portion of said length of wire forms a loop that extends in a cantilevered relationship to the ends thereof and forms said resilient structure.

13. A wafer probe head assembly as recited in claim 12 wherein a wafer pad engaging probe tip is affixed to and carried by said loop.

14. A wafer probe head assembly as recited in claim 10 wherein said length of wire forms a bridge over an area of said planer lower surface intended to overlie a wafer pad to be contacted.

15. A wafer probe head assembly as recited in claim 14 wherein a probe tip is formed on a mid span portion of said bridge.

16. A wafer probe head assembly as recited in claim 1 wherein said plurality of electrical signal conductors include spring members forming a part of said suspension means.

17. A wafer probe head assembly as recited in claim 1 wherein said resilient suspension means includes a plurality of bellows-like devices forming pneumatic means for applying resilient forces between said adapter board and said probe card assembly.

18. A wafer probe head assembly as recited in claim 17 wherein said plurality of bellows-like devices are pneumatically linked together and apply forces of equal magnitude between said adapter board and said probe card assembly.

19. A wafer probe head assembly as recited in claim 18 wherein said resilient suspension means further includes adjustable pneumatic pressure selection means pneumatically linked to each of said plurality of bellows-like devices.

* * * * *